US011361462B2

(12) United States Patent
Shimizu et al.

(10) Patent No.: US 11,361,462 B2
(45) Date of Patent: Jun. 14, 2022

(54) METHOD OF EVALUATING INNER CIRCUMFERENCE OF QUARTZ CRUCIBLE AND QUARTZ CRUCIBLE INNER CIRCUMFERENCE EVALUATION APPARATUS

(71) Applicant: SUMCO CORPORATION, Tokyo (JP)

(72) Inventors: Yasunobu Shimizu, Tokyo (JP); Keiichi Takanashi, Tokyo (JP); Toshihiko Uchida, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 272 days.

(21) Appl. No.: 16/587,235

(22) Filed: Sep. 30, 2019

(65) Prior Publication Data
US 2020/0118286 A1 Apr. 16, 2020

(30) Foreign Application Priority Data

Oct. 15, 2018 (JP) .............................. JP2018-194023

(51) Int. Cl.
*G06T 7/62* (2017.01)
*G06T 7/13* (2017.01)
(Continued)

(52) U.S. Cl.
CPC ................ *G06T 7/62* (2017.01); *C30B 15/10* (2013.01); *C30B 29/06* (2013.01); *G06T 7/0004* (2013.01);
(Continued)

(58) Field of Classification Search
None
See application file for complete search history.

(56) References Cited

U.S. PATENT DOCUMENTS 5,846,318 A * 12/1998 Javidi ..................... C30B 15/20
117/14
6,454,851 B1 * 9/2002 Fuerhoff ................. C30B 15/02
117/15
(Continued)

FOREIGN PATENT DOCUMENTS

CN 1268194 A 9/2000
JP 2004-292213 10/2004

OTHER PUBLICATIONS

Gjølstad, Endre Arnesen. "Advanced Camera Detection and Measurement System in the Czochralski Process." Master's thesis, NTNU, Jun. 2018. (Year: 2018).*

(Continued)

*Primary Examiner* — Emily C Terrell
*Assistant Examiner* — Nathan J Bloom
(74) *Attorney, Agent, or Firm* — Greenblum & Bernstein, P.L.C.

(57) ABSTRACT

Provided is an evaluation method capable of easily evaluating the inner circumference of a quartz crucible in a short time. The method of evaluating an inner circumference of a quartz crucible includes: a first step of imaging the inner circumference of the quartz crucible, thereby obtaining an image of the inner circumference; a second step of performing image processing on the image to obtain an edge image in which boundaries between cristobalite and glass are defined; a third step of extracting closed regions; a fourth step of performing arithmetic calculations on coordinate information of the boundaries, thereby obtaining calculated values; a fifth step of determining whether the closed regions are the cristobalite or the glass based on the calculated values; and a sixth step of compositing images in which closed regions are determined to be the cristobalite are overlaid, thereby obtaining a full image.

12 Claims, 16 Drawing Sheets

(51) Int. Cl.
  C30B 15/10 (2006.01)
  C30B 29/06 (2006.01)
  G06T 7/00 (2017.01)
  G06T 7/12 (2017.01)

(52) U.S. Cl.
  CPC ................ G06T 7/12 (2017.01); G06T 7/13 (2017.01); G06T 7/97 (2017.01); *G06T 2207/10016* (2013.01); *G06T 2207/30108* (2013.01)

(56) References Cited

U.S. PATENT DOCUMENTS

| | | | |
|---|---|---|---|
| 9,790,116 B2* | 10/2017 | Buckenauer | C03B 17/04 |
| 2009/0064923 A1* | 3/2009 | Takanashi | C30B 15/26 |
| | | | 117/15 |
| 2010/0319611 A1* | 12/2010 | Orschel | C30B 29/06 |
| | | | 117/15 |
| 2011/0170786 A1* | 7/2011 | Naini | G06T 7/64 |
| | | | 382/199 |
| 2012/0145068 A1* | 6/2012 | Takanashi | C30B 29/06 |
| | | | 117/15 |
| 2014/0326172 A1* | 11/2014 | Sudo | C30B 15/26 |
| | | | 117/15 |
| 2017/0096747 A1* | 4/2017 | Takanashi | C30B 15/203 |
| 2018/0045639 A1* | 2/2018 | Sudo | C30B 29/06 |
| 2019/0122392 A1* | 4/2019 | Yamanashi | G06T 5/50 |

OTHER PUBLICATIONS

Office Action for CN App. No. 20191097442.4, dated Mar. 23, 2021 (w/ translation).

* cited by examiner

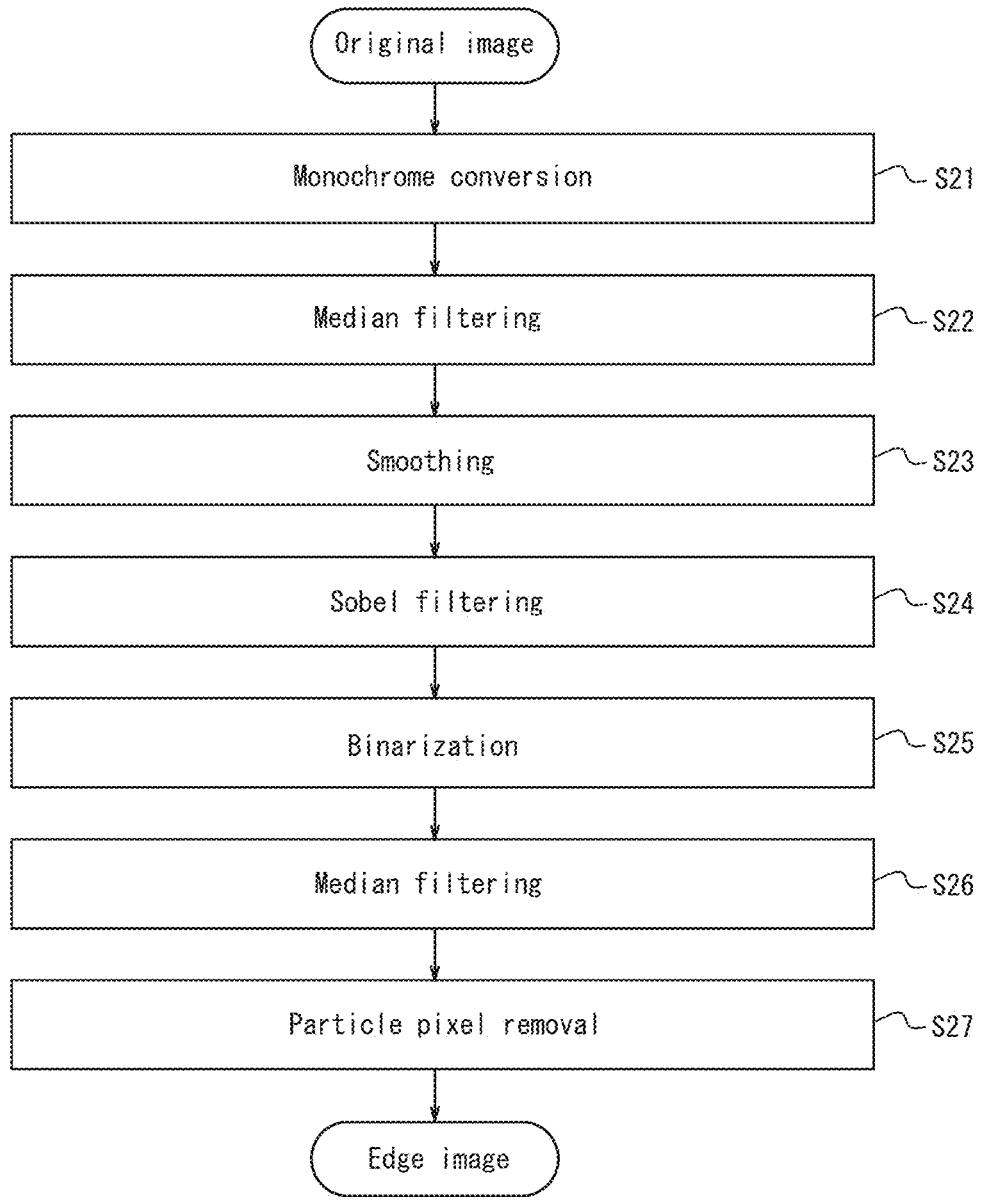

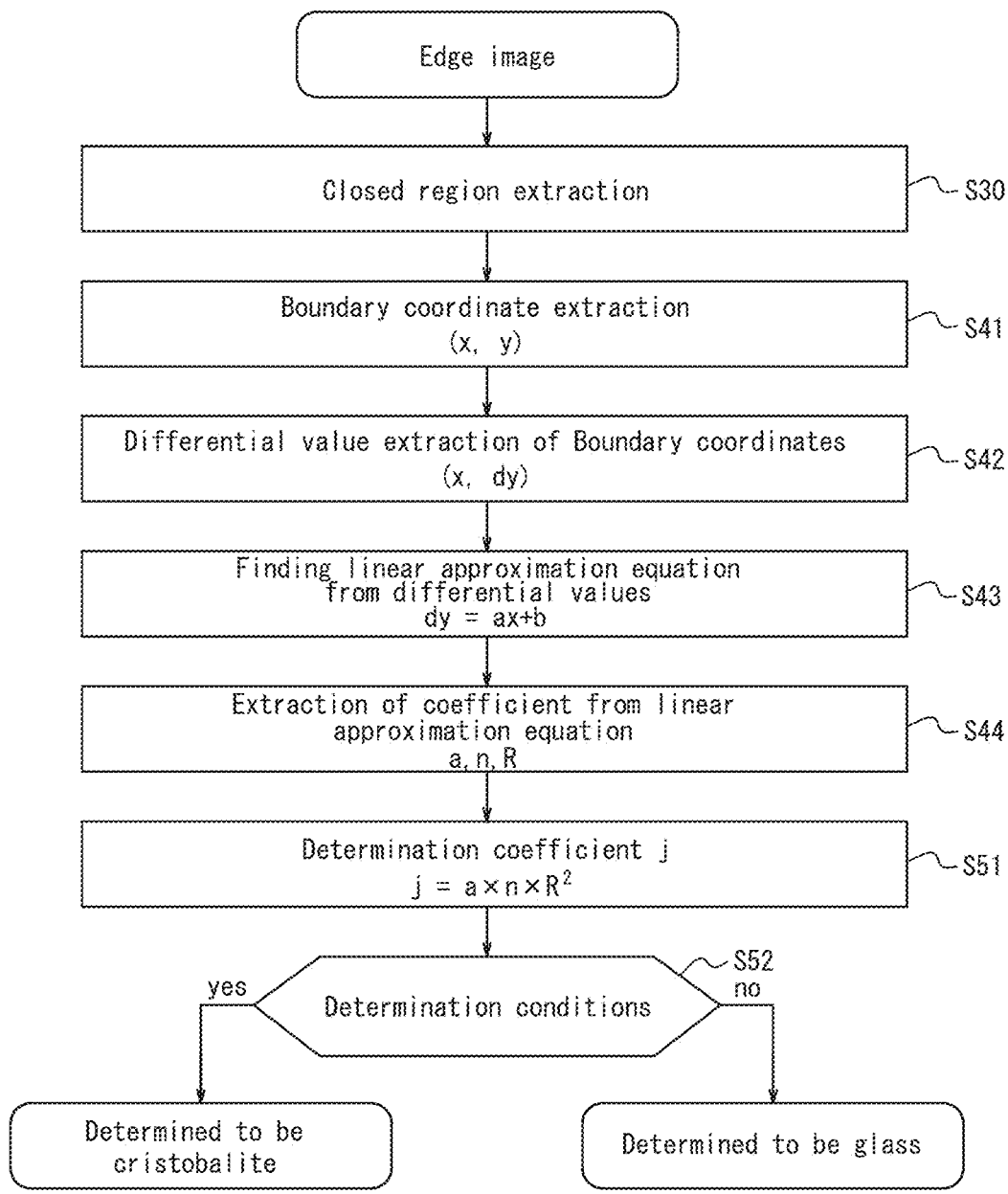

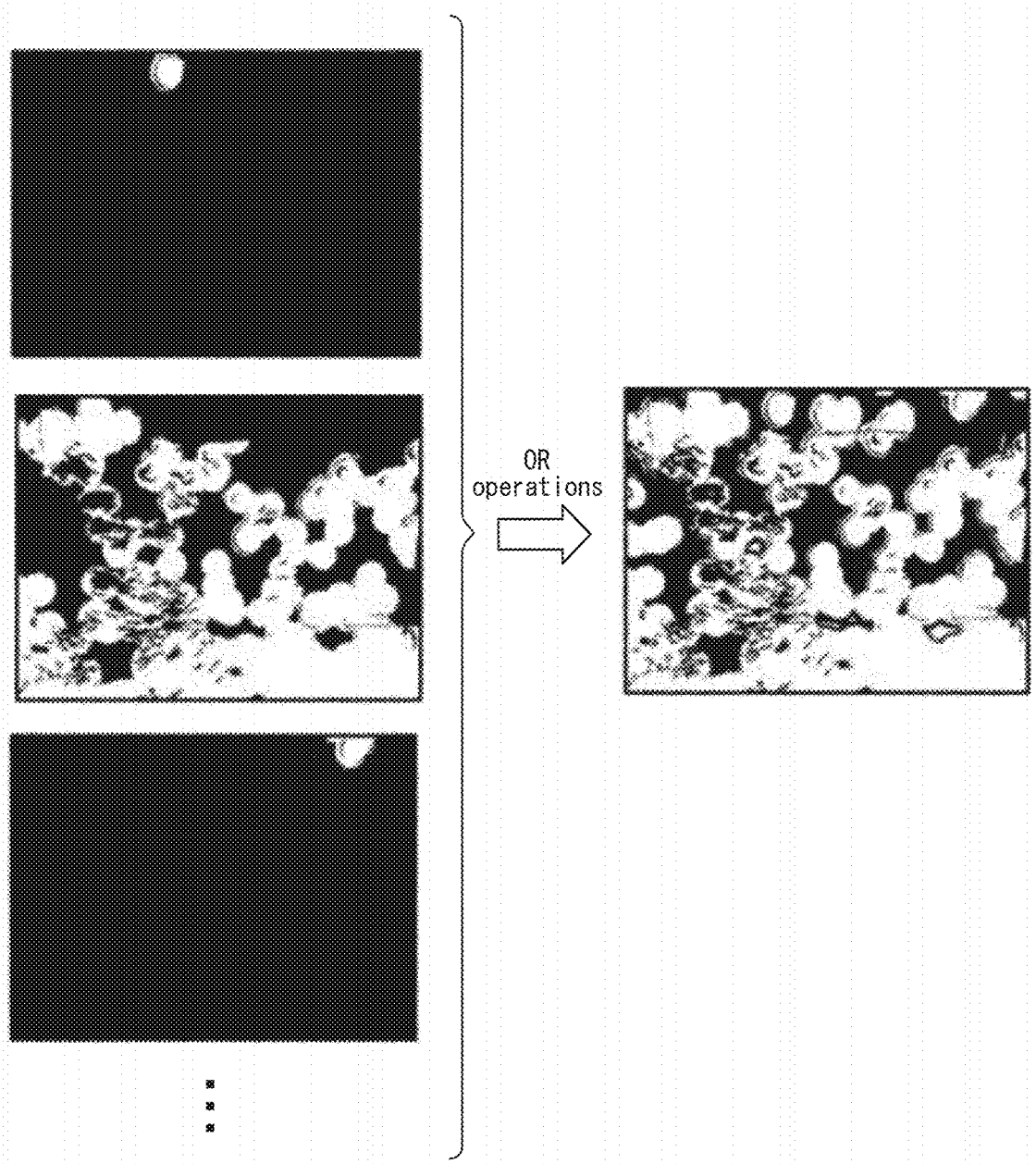

METHOD OF EVALUATING INNER CIRCUMFERENCE OF QUARTZ CRUCIBLE AND QUARTZ CRUCIBLE INNER CIRCUMFERENCE EVALUATION APPARATUS

TECHNICAL FIELD

This disclosure relates to a method of evaluating the inner circumference of a quartz crucible and a quartz crucible inner circumference evaluation apparatus.

BACKGROUND

A silicon wafer used as a substrate of a semiconductor device is produced by cutting a silicon single crystal ingot grown by a silicon single crystal growth apparatus into thin slices and subjecting the slices to a surface grinding (lapping) step, an etching step, a mirror polishing (polishing) step, etc. The Czochralski (CZ) process is known as a method of growing a silicon single crystal ingot. In the CZ process, a silicon melt is stored in a quartz crucible. A seed crystal is brought into contact with the silicon melt in the crucible and is slowly pulled up while being rotated, thus a silicon single crystal ingot is grown.

Here, during the crystal pulling of the silicon single crystal ingot, the contact between the molten silicon melt and the quartz creates a crystalline layer (referred to as "cristobalite") on the inner circumference of the quartz crucible. An example of cristobalite formed on the inner circumference of the quartz crucible after the crystal pulling is given in the photograph of FIG. 1. A boundary between cristobalite and transparent glass (quartz) is called a brown ring, and brown rings observed in FIG. 1 have a shape in which brown rings and brown circular arcs are connected.

During crystal pulling, when cristobalite formed on the inner circumference of the quartz crucible is partially delaminated and introduced into the silicon melt, the cristobalite is considered to reach the solid-liquid interface of the silicon single crystal ingot being grown and produce dislocations. To address this, there have been attempts to develop a quartz crucible and a pulling technique which make cristobalite difficult to be formed on the inner circumference. On the other hand, there also have been attempts to develop a quartz crucible and a pulling technique which force cristobalite to be formed across the inner circumference.

For example, JP 2004-292213 A (PTL 1) discloses a quartz crucible using synthetic quartz glass in which 2 ppm or more of calcium oxide is contained in a surface part of the inner circumference of the quartz crucible and the OH content is 100 ppm or more. In PTL 1, cristobalite is formed across the inner circumference of the quartz during heating for pulling to prevent inclusion of cristobalite in a silicon melt.

CITATION LIST

Patent Literature

PTL 1: JP 2004-292213 A

SUMMARY

PTL 1 refers to the formation of cristobalite on the inner circumference of the quartz crucible, but does not disclose any specific method of evaluating the state of the cristobalite formed. In conventional techniques, to quantify and evaluate the state of the cristobalite formed, a worker sketches the inner circumference of the quartz crucible by manual operation and the area ratio of the cristobalite formed is quantified and evaluated based on the obtained sketch.

In the conventional techniques, since cristobalite is evaluated based on the sketch, the difference between the state of the cristobalite actually formed and the state of cristobalite found in the sketch must be lame, and the evaluation would inevitably vary depending on the worker. Since the operation is performed manually, it takes a long time to make the sketch (approximately 90 min per one section of the quartz crucible segmented into 10 sections); accordingly, only part of the quartz crucible is actually sketched.

It could therefore be helpful to provide an evaluation method capable of easily evaluating the inner circumference of a quartz crucible in a short time and an apparatus for evaluating the inner circumference of the quartz crucible that is used for the evaluation method.

We made diligent studies to achieve the above objectives. We thus found that when a captured image of the inner circumference of a quartz crucible from which a silicon single crystal ingot has been pulled up is subjected to arithmetic calculations based on the outer ring shapes of cristobalite, whether cristobalite or glass is formed can be determined. This disclosure is based on the above findings and we propose the following features.

(1) A method of evaluating an inner circumference of a quartz crucible, comprising:
a first step of imaging the inner circumference of the quartz crucible from which a silicon single crystal ingot has been pulled up, thereby obtaining a captured image of the inner circumference;
a second step of performing image processing on the captured image to obtain an edge image in which boundaries between cristobalite and glass are extracted;
a third step of extracting closed regions enclosed by the boundaries in the edge image;
a fourth step of performing arithmetic calculations on coordinate information of the boundaries enclosing the extracted closed regions based on outer ring shapes of the cristobalite, thereby obtaining calculated values;
a fifth step of determining whether the closed regions are the cristobalite or the glass based on the calculated values; and
a sixth step of compositing images in which closed regions are determined to be the cristobalite are overlaid, thereby obtaining a full image.

(2) The method of evaluating an inner circumference of a quartz crucible, according to (1) above, wherein in the fourth step, a straight-line approximation equation of differential values found from the coordinate information of the boundaries is calculated.

(3) The method of evaluating an inner circumference of a quartz crucible, according to (2) above, wherein in the fifth step, the determination is performed based on a slope of the straight-line approximation equation.

(4) The method of evaluating an inner circumference of a quartz crucible, according to (1) above, wherein in the fourth step, one or more approximate circles inscribed in each boundary are calculated from the coordinate information of the boundaries.

(5) The method of evaluating an inner circumference of a quartz crucible, according to (4) above, wherein in the fifth step, the determination is performed based on positional relationship between center coordinates of the approximate circles and the closed regions.

(6) The method of evaluating an inner circumference of a quartz crucible, according to any one of (1) to (5) above, wherein in the fifth step, determination values are found by weighting using the calculated values and the number of data used to find the calculated values in the fourth step, and the determination is performed using the determination values.

(7) The method of evaluating an inner circumference of a quartz crucible, according to any one of (1) to (6) above, further comprising a seventh step of quantifying and evaluating the cristobalite formed on the inner circumference based on the full image obtained in the sixth step.

(8) An apparatus for evaluating an inner circumference of a quartz crucible, comprising:

an imager that is slidably installed along a central axis of the quartz crucible and is rotatably mounted about the central axis inside the quartz crucible; and an arithmetic unit which processes a captured image of the inner circumference of the quartz crucible, taken by the imager, wherein the processes performed by the arithmetic unit includes:

(i) performing image processing on the captured image to obtain an edge image in which boundaries between cristobalite and glass are extracted;

(ii) extracting closed regions enclosed by the boundaries in the edge image and performing arithmetic calculations on coordinate information of the boundaries enclosing the extracted closed regions based on outer ring shapes of the cristobalite, thereby obtaining calculated values;

(iii) determining whether the closed regions are the cristobalite or the glass based on the calculated values; and (iv) compositing images in which closed regions are determined to be the cristobalite are overlaid, thereby obtaining a full image.

This disclosure can provide an evaluation method capable of easily evaluating the inner circumference of a quartz crucible in a short time and an apparatus for evaluating the inner circumference of the quartz crucible that is used for the evaluation method.

BRIEF DESCRIPTION OF THE DRAWINGS

In the accompanying drawings,

FIG. 5 is a flow chart illustrating an aspect of a second step of the evaluation method according to this disclosure;

FIG. 7 is a flow chart illustrating an aspect of the third to fifth steps of the evaluation method according to this disclosure;

FIG. 12 is a composite image acquired by overlaying the closed regions determined to be cristobalite from the edge image of FIG. 8A;

DETAILED DESCRIPTION

Figure 3:
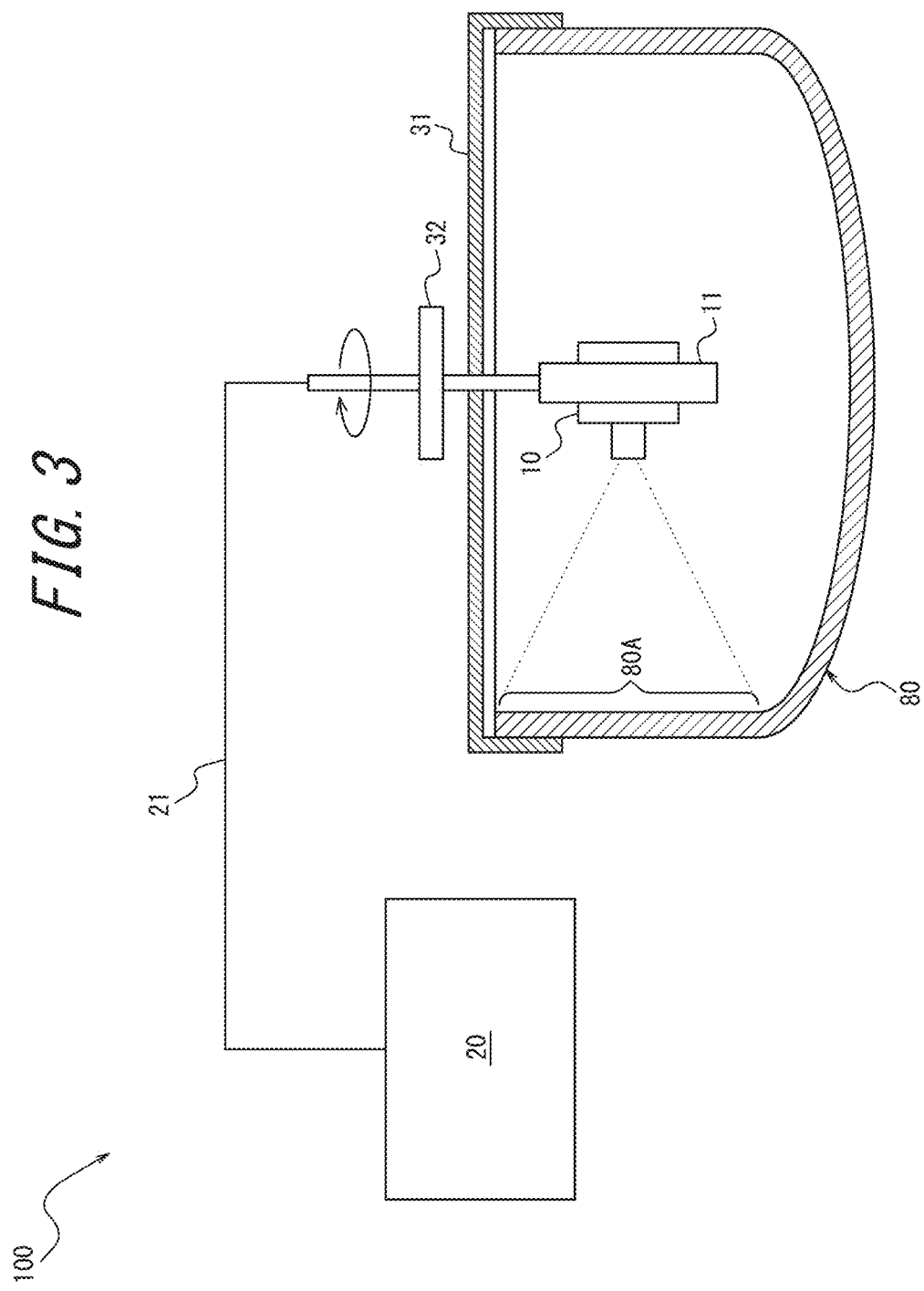
FIG. 3 is a schematic view of an evaluation apparatus applicable to a method of evaluating the inner circumference of a quartz crucible according to this disclosure.

Embodiments of this disclosure will now be described with reference to the drawings. Note that the features in FIG. 3 are vertically or horizontally exaggerated for convenience of description, and the components are not to scale.

(1. Method of Evaluating Inner Circumference of Quartz Crucible)

Figure 2:
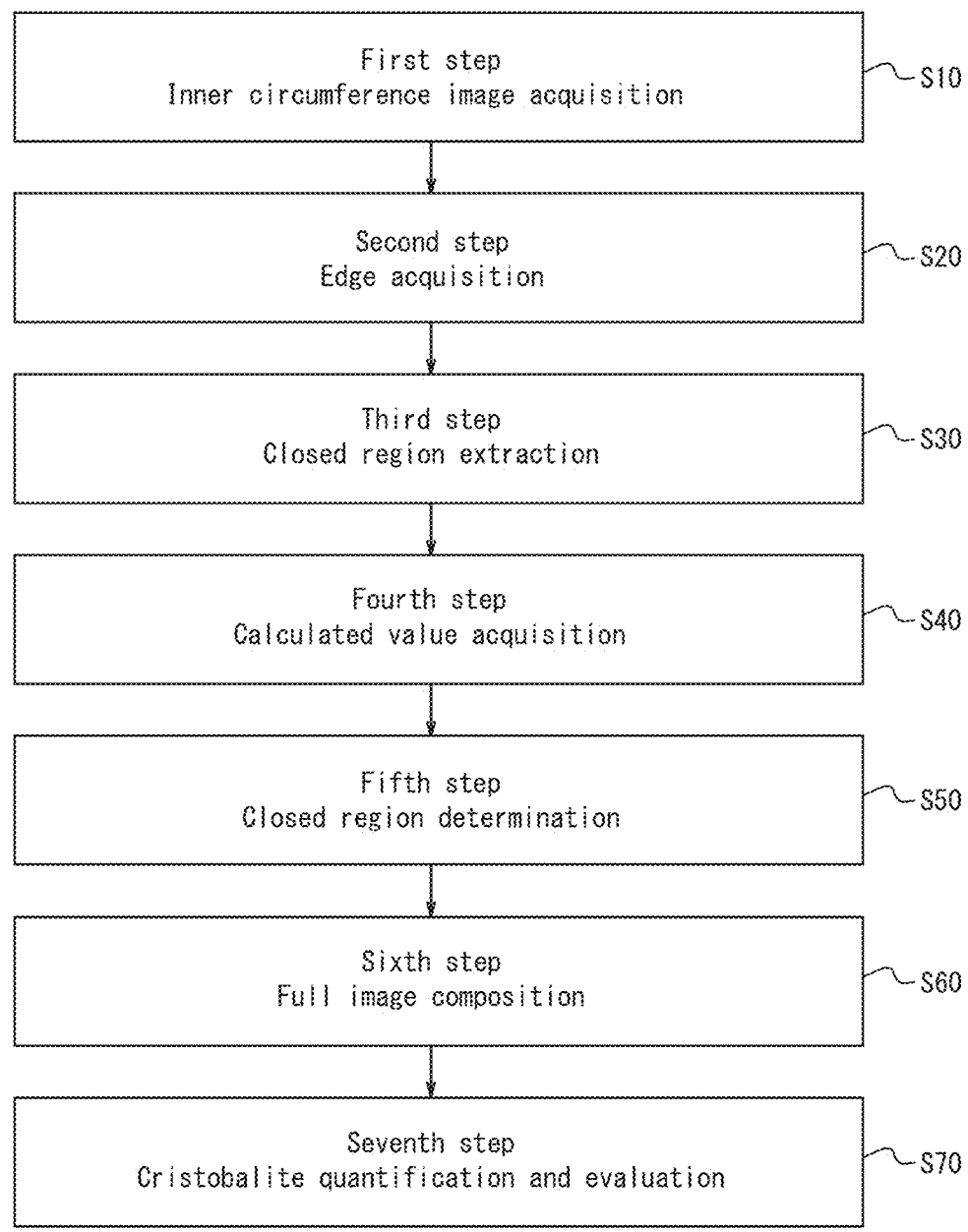
FIG. 2 is a flow chart for illustrating one embodiment of a method of evaluating the inner circumference of a quartz crucible according to this disclosure.

Reference is made to the flow chart in FIG. 2. A method of evaluating the inner circumference of a quartz crucible, according to one embodiment of this disclosure includes: a first step of imaging the inner circumference of the quartz crucible from which a silicon single crystal ingot has been pulled up, thereby obtaining a captured image of the inner circumference (S10); a second step of performing image processing on the captured image to obtain an edge image in which boundaries between cristobalite and glass are extracted (S20); a third step of extracting closed regions enclosed by the boundaries in the edge image (S30); a fourth step of performing arithmetic calculations on coordinate information of the boundaries enclosing the extracted closed regions based on outer ring shapes of the cristobalite, thereby obtaining calculated values (S40); a fifth step of determining whether the closed regions are the cristobalite or the glass based on the calculated values (S50); and a sixth step of compositing images in which closed regions are determined to be the cristobalite are overlaid, thereby obtaining a full image (S60). These steps will be sequentially described in detail below.

<First Step>

In the first step (S10), the inner circumference of the quartz crucible from which a silicon single crystal ingot has been pulled up is imaged, thereby obtaining a captured image of the inner circumference. An example of an image acquisition technique in this step is described with reference to the schematic view of FIG. 3.

A crucible inner circumference evaluation apparatus 100 depicted in FIG. 3 has an imager 10. An illuminator 11 may be provided on either side of the imager 10, this ensures that reflection of light can be prevented. Further, in FIG. 3, since the imager 10 is supported by a cross arm 31 and a handle 32, the imager 10 is slidably installed along a central axis of the quartz crucible 80 and is rotatably mounted about the central axis inside the quartz crucible 80. In FIG. 3, the imager 10 is connected to an arithmetic unit 20 including a computer for analysis and others via a camera link cable 21. Note that although not shown, residual crystal may be left as a residue at the bottom of the quartz crucible 80.

Figure 4:
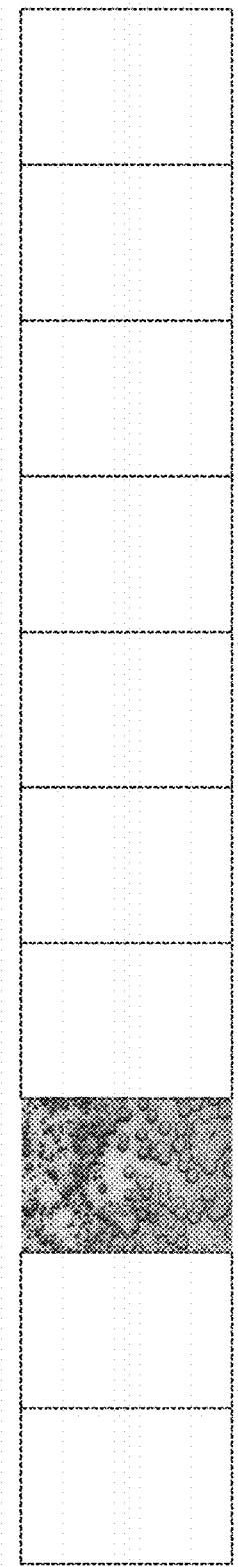
FIG. 4 is a photograph depicting an example of a captured image taken by a first step of the evaluation method according to this disclosure.

Using such an imager 10 of the evaluation apparatus 100, a given imaged area 80A in the inner circumference of the quartz crucible 80 is imaged to obtain a captured image. A captured image of the entire inner circumference of the quartz crucible 80 can also be acquired by rotating the imager 10 about the central axis of the crucible 80 and successively obtaining captured images. FIG. 4 depicts, as a representative example, one of ten captured images successively taken while rotating the imager 10 at 36° intervals. Note that FIG. 4 is obtained by coloring for sharpening an image presented in this specification. Images of specific examples of the second and subsequent steps are obtained by performing the following image processing on the colored captured image. However, there is no harm in performing image processing of the second and subsequent steps without performing such coloring.

<Second Step>

Figure 1:
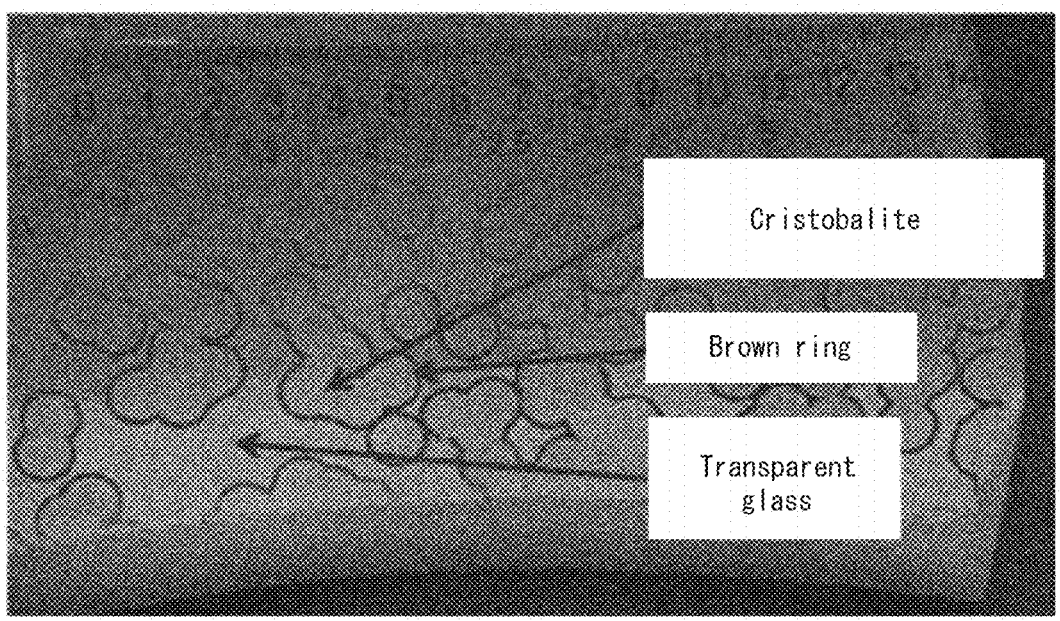
FIG. 1 is a photograph depicting an example of cristobalite formed on the inner circumference of a quartz crucible.

In the second step (S20), image processing is performed on the captured image acquired in the first step (S10) to obtain an edge image in which boundaries between cristobalite and glass are extracted. As in an example of the inner circumference of the quartz crucible above illustrated in FIG. 1, cristobalite is formed on the inner circumference of the quartz crucible from which a silicon single crystal ingot has been pulled up. Cristobalite is transparent, and amorphous glass is also transparent. Since both of them are transparent, they cannot be distinguished from one another in the image; however, brown rings are visible at the boundaries between cristobalite and glass. Here, in this step, image processing is performed to obtain an edge image in which brown rings are extracted by treating the brown rings as the boundaries between cristobalite and glass. As specific image processing, typical image filtering including, for example, binarization may be performed, and the processing is described below using specific examples with reference to FIG. 5 and FIG. 6.

<<One Aspect of Second Step>>

FIG. 5 depicts a flow chart of an aspect of the second step (S20). First, since the captured image obtained in the first step (hereinafter referred to as an original image) is a color image, the image is subjected to a monochrome conversion (S21) to obtain a multi-level monochrome image. Next, the monochrome image is sequentially subjected to median filtering (S22), smoothing (S23), and Sobel filtering (S24). The monochrome image having been subjected to Sobel filtering (S24) is subjected to binarization (S25) to obtain a binary image. This binary image is further subjected to median filtering (S26) to perform particle pixel removal (S27). The particle pixel removal (S27) is a process in which a given threshold area is set for the connected pixel information, and the connected pixel information in the range of the threshold area is regarded as negligible pixel information having no influence on the determination of cristobalite in inverting binarized pixel information.

<<Specific Example of Second Step>>

Figure 6A:
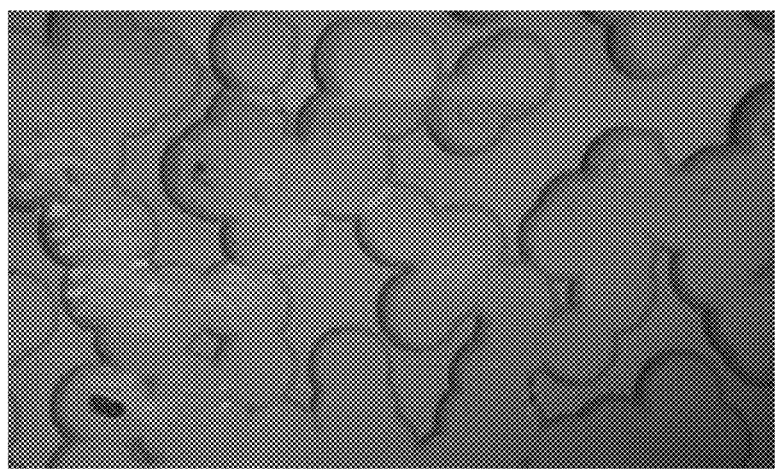
FIG. 6A is a specific example depicting a part of a captured image taken in the first step of the evaluation method according to this disclosure.
Figure 6B:
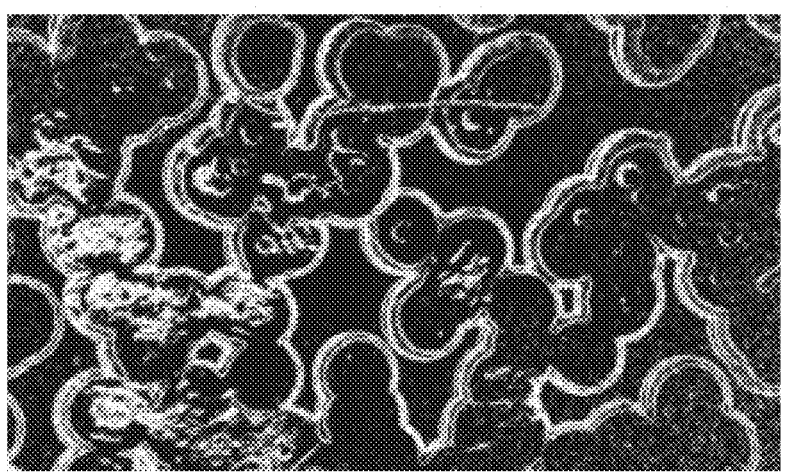
FIG. 6B is a binary image after binarization performed on FIG. 6A in the second step of the evaluation method according to this disclosure.
Figure 6C:
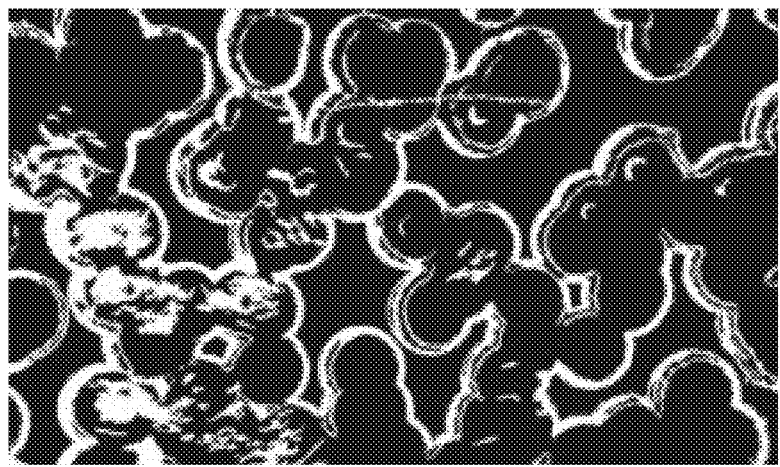
FIG. 6C is an edge image acquired in the second step of the evaluation method according to this disclosure, performed on FIG. 6B.

A specific example of the edge image obtained according to the flow chart of FIG. 5 is given with reference to FIG. 6A to FIG. 6C. FIG. 6A is a part of the captured image obtained in the first step, and is used as an original image.

The original image of FIG. 6A is subjected to a monochrome conversion (S21) to obtain 256 level monochrome image, and is sequentially subjected to 20 rounds of median filtering (S22), 3 rounds of smoothing (S23), and one round of Sobel filtering (S24). Further, a threshold level 5 (0 means black, 255 means white) is set for the 256 level monochrome image having been subjected to the filtering processes, and binarization (S25) is performed in which pixels of a level exceeding the threshold are determined to be black pixels whereas pixels of a level less than the threshold are determined to be white pixels, thereby obtaining a binary image. The binary image is displayed in FIG. 6.

The binary image is further subjected to 30 rounds of median filtering (S26) in this specific example and finally to particle pixel removal (S27) in which the threshold value area is set to 450×450 pixel area, thereby obtaining the edge image displayed in FIG. 6C.

Note that the number of filtering rounds, the threshold setting (the grayscale threshold and area threshold), the number of levels of the monochrome image, etc. in the above processes (S21 to S27) performed to obtain the edge image displayed in FIG. 6C are given as examples. These may be appropriately set so that the shape of the brown rings can be clear. The flow chart given in FIG. 5 also illustrates only an example of filtering processes; known filtering for noise reduction may be performed as appropriate, and the order of the filtering processes may be changed. Further, FIG. 6B and FIG. 6C depict boundaries of brown rings that are processed as white pixels in the binarization. It shall be naturally understood that when boundaries of brown rings are processed as black pixels, the closed regions in the boundaries are white pixels conversely. For convenience of description, the following description is based on the pixel processing described in the specific example of the second step.

<Third Step to Fifth Step>

Subsequent to the second step (S20), a third step of extracting closed regions enclosed by the boundaries in the edge image (S30); a fourth step of performing arithmetic calculations on coordinate information of the boundaries enclosing the extracted closed regions based on outer ring shapes of the cristobalite, thereby obtaining calculated values (S40); and a fifth step of determining whether the closed regions are the cristobalite or the glass based on the calculated values (S50) are performed. Whether the regions enclosed by the boundaries in the edge image are the cristobalite or the glass is determined by performing the steps from the third step to the fifth step.

These steps will now be described using specific examples with reference to the flow chart illustrating one aspect of the third step to the fifth step illustrated in FIG. 7. As illustrated in FIG. 7, the closed regions enclosed by the boundaries of brown rings are extracted first (S30). Next, in the fourth step (S40), boundary coordinates (x,y) are extracted (S41), differential values (x,dy) of the boundary coordinates are extracted (S42), a line approximation equation (dy=ax+b; a is the slope, and b is the intercept of the dy coordinates) is found from the differential values (S43), and approximation coefficients (a, n, R; a is the slope, n is the number of data used to derive the straight-line approximation equation, and R is the coefficient of correlation) are extracted from the straight-line approximation equation (S44). In the fifth step (S50), a determination coefficient j is calculated (S51), and whether the closed regions extracted in the third steep are formed from cristobalite or from glass is determined according to determination conditions (S52). These steps are now described sequentially.

Figure 8A:
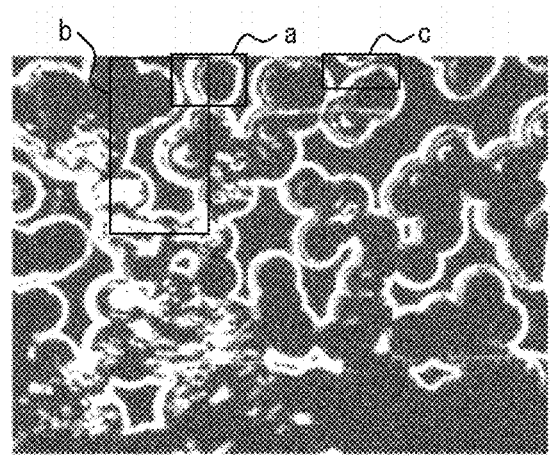
FIG. 8A is an image of the edge image illustrated in FIG. 6C to which extraction object regions a to c are added.
Figure 8B:
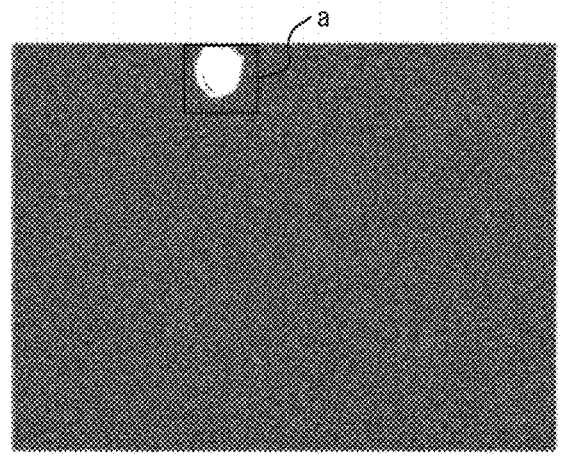
FIG. 8B is a closed region extracted from the region a in FIG. 8A.
Figure 8C:
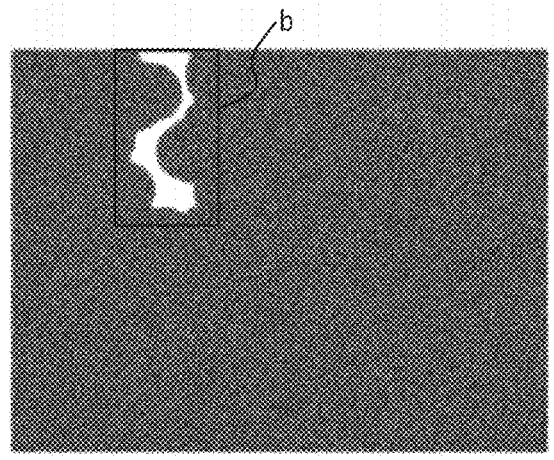
FIG. 8C is a closed region extracted from the region b in FIG. 8A.

First, in the third step, closed regions enclosed by the boundaries in the edge image are extracted (S30). FIG. 8A is an image of FIG. CC described above, to which specific extraction object regions a to c are added. The third step is described with reference to FIG. 8A to FIG. 8C. For convenience of description, the shades of gray of FIG. 8A to FIG. 8C have been changed from those of FIG. 6C; however, the image processing is performed also on the binary image. The extraction object region a in FIG. 8A is enclosed by pixels representing the boundary of a brown ring (white pixels), and all the black pixels inside the boundary are handled as a mass. In the example of FIG. 8B, the black pixels inside the boundary are inverted to white pixels. The white pixels corresponding to the boundary and the white pixels obtained by the inversion to the white pixels are collectively taken as the closed region with respect to which calculated values are obtained in the fourth step. Another specific example is described with reference to the region b in FIG. 8A. The region b in FIG. 8A is enclosed by pixels representing the boundary of a brown ring (white pixels), and all the black pixels inside the boundary are handled as a mass. The black pixels inside the boundary are inverted to white pixels. Thus, the closed region depicted in FIG. 8C is extracted. The pixel data for each boundary are, for example, subjected to such an inversion process, thereby extracting all closed regions. Note that here, the four sides corresponding to the ends of the edge image are also treated as an equivalent to the boundary of a brown ring (white pixels).

Figure 9A:
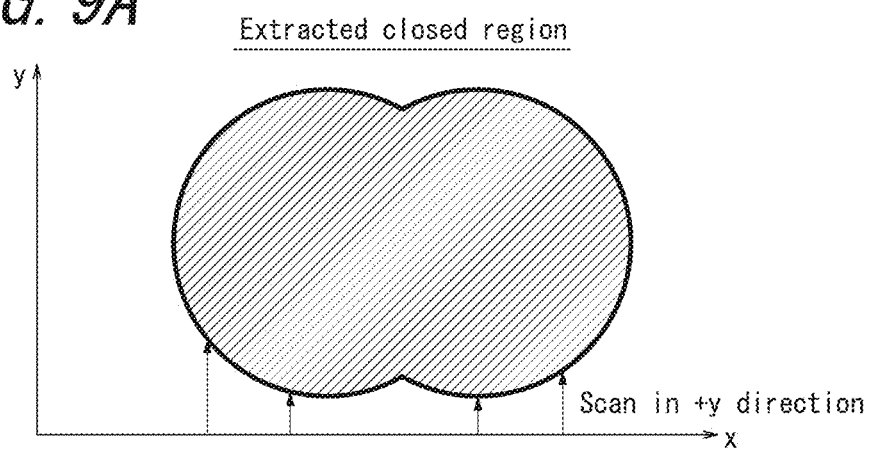
FIG. 9A is a conceptual diagram illustrating a specific example of arithmetic calculations in the fourth step of the evaluation method according to this disclosure.
Figure 9B:
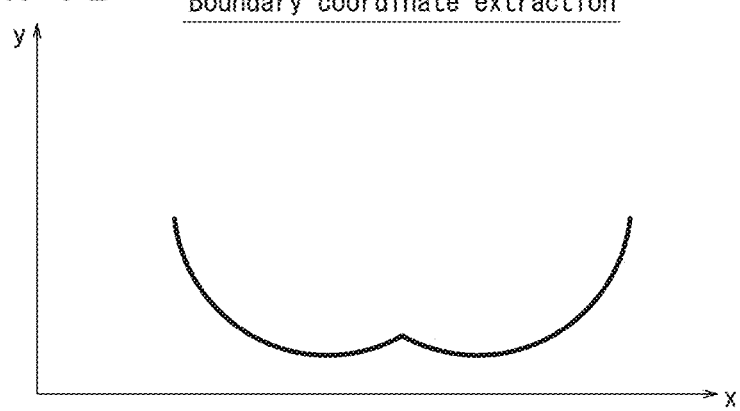
FIG. 9B is a conceptual diagram illustrating a specific example of the arithmetic calculations subsequently to FIG. 9A.
Figure 9C:
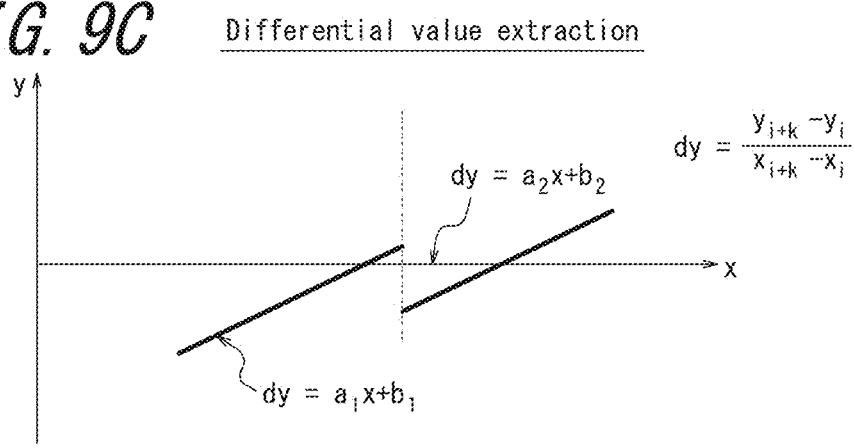
FIG. 9C is a conceptual diagram illustrating a specific example of the arithmetic calculations subsequently to FIG. 9B.

Next, a specific example of the fourth step S40 is described with reference to the steps S41 to S44 given in the flow chart of FIG. 7 and FIG. 9A to FIG. 9C. FIG. 9A to FIG. 9C depict conceptual diagrams in which differential values numerical differential values) are found from coordinate information of a boundary defining an extracted closed region, and a straight-line approximation equation for the differential values is calculated. Note that the hatched area and the boundary line in FIG. 9A correspond to the white pixels in the extracted image of the specific example described above.

In the step of extraction of boundary coordinates (S41), when scanning is started from a portion where black pixels are predominant, scanning is performed to a portion where the ratio of white pixels is the highest; otherwise, scanning is started from a portion where white pixels are predominant, scanning is performed to a portion where the ratio of black pixels is the highest. Referring to the specific example in FIG. 9A and FIG. 9B, the extracted closed region (white pixel area) is subjected to an extraction step of scanning from the x axis (corresponding to black pixels) in the +y direction to find boundary coordinate information (x,y) (S41). Next, referring to FIG. 9B and FIG. 9C, a differential value dy is extracted from the coordinate information (x,y) found. The differential value dy is given by the following equation [1]. Here, k in the equation [1] is the differential interval, and is appropriately selected from integers of around 1 to 10 with an intention to find a straight-line approximation equation described below.

$$dy = \frac{y_{i+k} - y_i}{x_{i+k} - x_i} \quad [1]$$

The differential coordinates (x,dy) are obtained from the coordinate information (x,y) of the boundary depicted in FIG. 9B. A straight-line approximation equation (dy=ax+b; a is the slope, b is the intercept of the dy coordinates) in this differential coordinate system is found (see S43, FIG. 9C). In finding the straight-line approximation equation, known calculations such as the least square method may be performed. Note that there are discontinuous points of dy in the differential coordinate system depicted in FIG. 9C. Accordingly, different equations of straight-line approximation (dy=$a_1$x+dy=$a_2$x+$b_2$; $a_1$, $a_2$ are the slopes in the straight-line approximation equations, and $b_1$, $b_2$ are the intercepts of the respective straight-line approximation equations. Whether two points are continuous or discontinuous can be determined by setting a threshold for the value of dy.

In the specific example given in the flow chart of FIG. 7, approximation coefficients (a, n, R; a is the slope of the straight-line approximation equation, n is the number of data used to derive the straight-line approximation equation, and R is the coefficient of correlation) are extracted from the straight-line approximation equation and are adopted as calculated values (S44).

Subsequently, in the specific example Oven in the flow chart of FIG. 7, a determination coefficient j (by way of example, j=$a_1 \times n_1 \times R_1^2 + a_2 \times n_2 \times R_2^2$) is calculated (S51). Further, determination conditions are set for the determination coefficient j, and whether the closed region extracted in the third step is cristobalite or glass is determined based on the conditions (S52). The reasons for which such a determination is possible are described.

The shape of each brown ring formed on the inner circumference of a quartz crucible (the outline of cristobalite) is a circle-like shape or a ring-based shape in which a part of circles are connected as cristobalite grows. Accordingly, the region inside the ring shapes of a brown ring corresponds to cristobalite. Accordingly, in the xy coordinate system depicted in FIGS. 9A and 9B, when the locus of the boundary coordinates is a convex downward curve with respect to the x axis, the closed region inside the boundary can be determined to have the pixel information corresponding to cristobalite, and the outside of the boundary of the closed region can be determined to have the pixel information corresponding to glass. This being the case, the determination coefficient j is adopted so that whether the locus of the boundary coordinates is a convex downward curve or a convex upward curve can be determined from the calculated values found in the fourth step. Theoretically, whether the closed region corresponds to cristobalite or glass can be determined by whether the slope of the above straight line approximation equation (i.e., the second-order differential values of the boundary coordinates) is positive or negative. Note that as in this example, cristobalite may have a shape in which ring-shapes are connected, in which case a plurality of straight-line approximation equations are obtained. In such a case, the determination can be performed more accurately when using the determination coefficient j obtained by weighting using the slope a, the number of data n, and the coefficient of correlation R.

Further, such straight-line approximation equations are preferably found with respect to the other three directions (in this example, +x direction scanning, −x direction scanning, and −y direction scanning), since more appropriate calculated values based on the outer ring shapes of cristobalite can be obtained. The scanning direction may be one direction or a combination of the directions mentioned above. To perform the determination most accurately, weighting is preferably performed on the determination coefficients by scanning in the four directions. Specifically, the determination coefficient for the +x direction scanning is represented as $j_1$, the determination coefficient for the −x direction scanning is represented as $j_2$, the determination coefficient for the +y direction scanning is represented as $j_3$, and the determination coefficient for the −y direction scanning is represented as $j_4$, and the determination is preferably performed using the determination coefficient $J=j_1+j_2+j_3+j_4$. In Example below, this determination coefficient J was used.

Note that closed regions are extracted by, for example, performing the inversion of pixels in the above third step (S30). Accordingly, when the calculated values are sought in the fourth step (S40), any of the +x direction scanning, the −x direction scanning, the +y direction scanning, and the −y direction scanning gives the same determination result for cristobalite and glass determined due to the results of the calculations.

<<Specific Example of Calculations by Fourth Step>>

Specific examples of calculations by the fourth step (S40) are sequentially described with reference to FIG. 10A and FIG. 10B. The closed region extracted in the third step (S30) (the region c in FIG. 8A) is displayed on the left side in FIG. 10A. The white pixel region is the closed region to be subjected to the determination. For convenience of description, the black pixel area that is not to be subjected to the determination is depicted as a hatched area in FIG. 10A. This also applies to FIG. 10B, FIGS. 11A, and 11B described below.

Figure 10A:
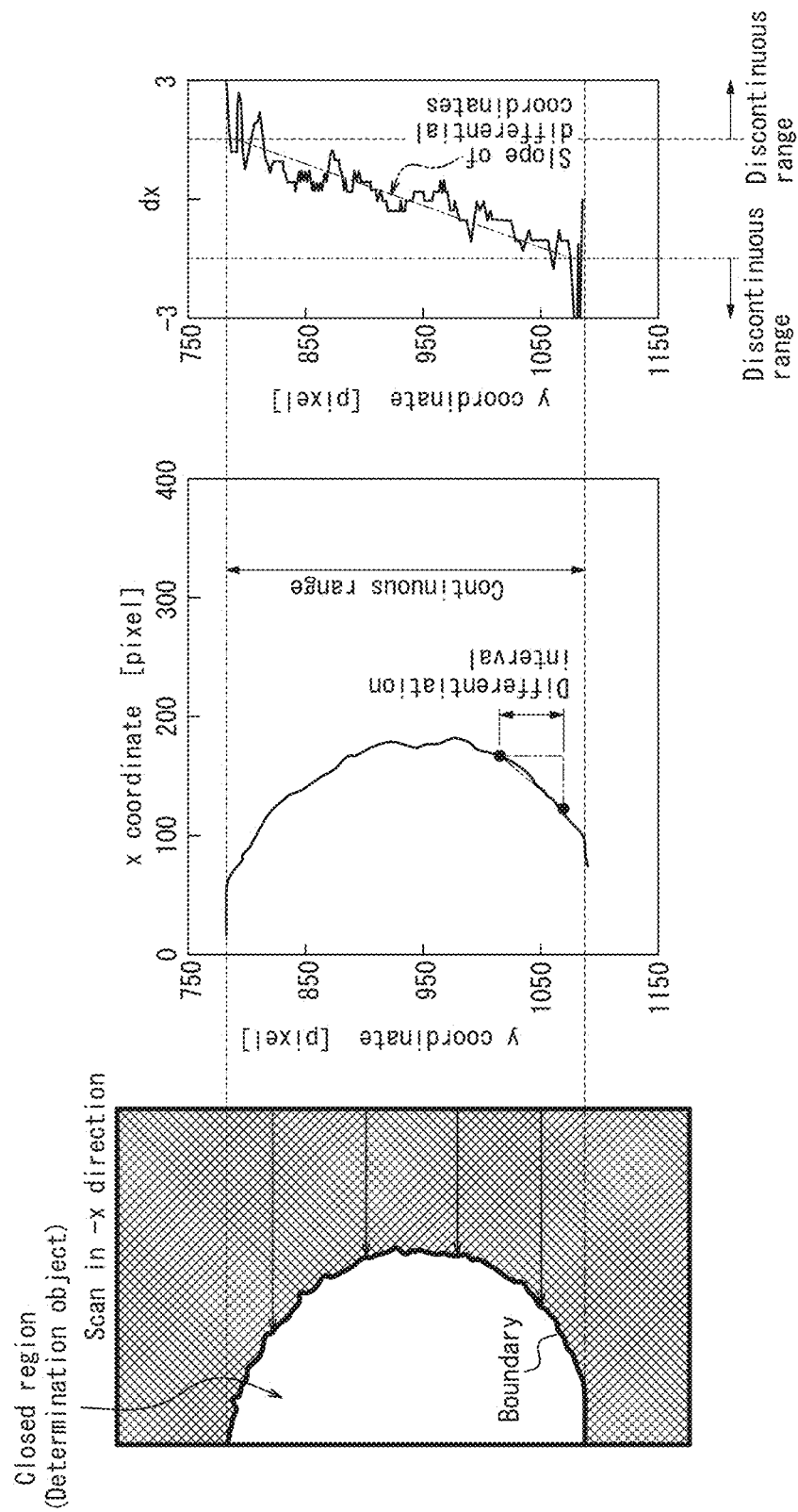
FIG. 10A is a diagram illustrating a specific example of a technique for obtaining calculated values in the fourth step of the evaluation method according to this disclosure, performed on the closed region extracted from the region c in FIG. 8A.

Reference is made to FIG. 10A. The −x direction scanning was performed to obtain the boundary coordinate information (the center in FIG. 10A). The differential coordinate system of dx (dx,y) was calculated assuming that the differential interval corresponded to 4 pixels (the right side in FIG. 10A). In this case, $dx=(x_{i+4}-x_i)/4$. The straight-line approximation equation of this differential coordinate system was sought and is depicted on the right side in FIG. 10A. In the differential coordinate system (dx,y), a continuous range was set assuming that regions in which dx was out of the threshold value range (dx<−1.5, dx>1.5) were discontinuous ranges. In the example of FIG. 10A, since the slope of the straight-line approximation equation found from (dx,y) is negative, the closed region to be subjected to the determination (white pixel area) can be determined to correspond to cristobalite.

Figure 10B:
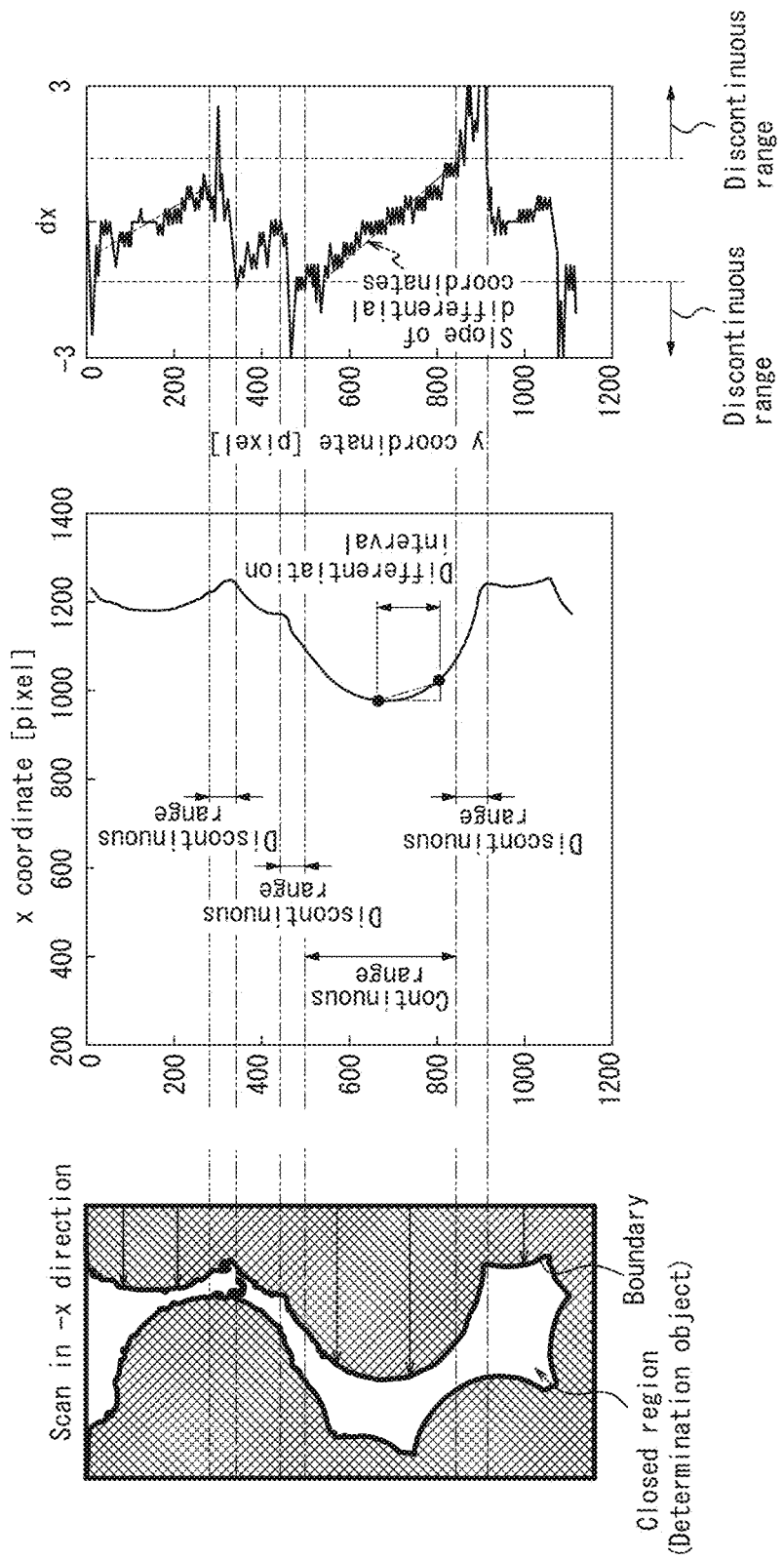
FIG. 10B is a diagram illustrating a specific example of a technique for obtaining calculated values in the fourth step of the evaluation method according to this disclosure, performed on the closed region extracted from the region b in FIG. 8A.

The closed region extracted in the third step (S30) (the region b in FIG. 8A) is displayed on the left side in FIG. 10B. The white pixel region is the closed region to be subjected to the determination. The −x direction scanning was performed to obtain the boundary coordinate information (the center in FIG. 10B). The differential coordinate system of dx (dx,y) was calculated assuming that the differential interval corresponded to 4 pixels (the right side in FIG. 10B). A straight-line approximation equation is obtained from this differential coordinate system. As in FIG. 10A, in the differential coordinate system (dx,y), a continuous range was set assuming that regions in which dx was out of the threshold value range (dx<−1.5, dx>1.5) were discontinuous ranges. Further, in the example of FIG. 10B, the weighting described above was performed to find the determination value $j(=\Sigma a \times n \times R^2)$, and the determination value j obtained by weighting the slope of dx was positive. Accordingly, the closed region to be subjected to the determination in this example (white pixel area) can be determined to correspond to glass. Note that the straight line approximation in the discontinuous region is not used for the calculation.

As has been specifically described with reference to FIG. 10A and FIG. 10B, calculations may be performed to find the straight-line approximation equation of the differential values obtained from the boundary coordinate information (x,y), thereby determining the calculated values (i.e., including the slope a of the straight-line approximation equation) by the fourth step. In the fifth step, the determination can be performed based on the value of the slope a of the straight-line approximation equation.

<<Another Specific Example of Calculations by Fourth Step>>

Figure 11A:
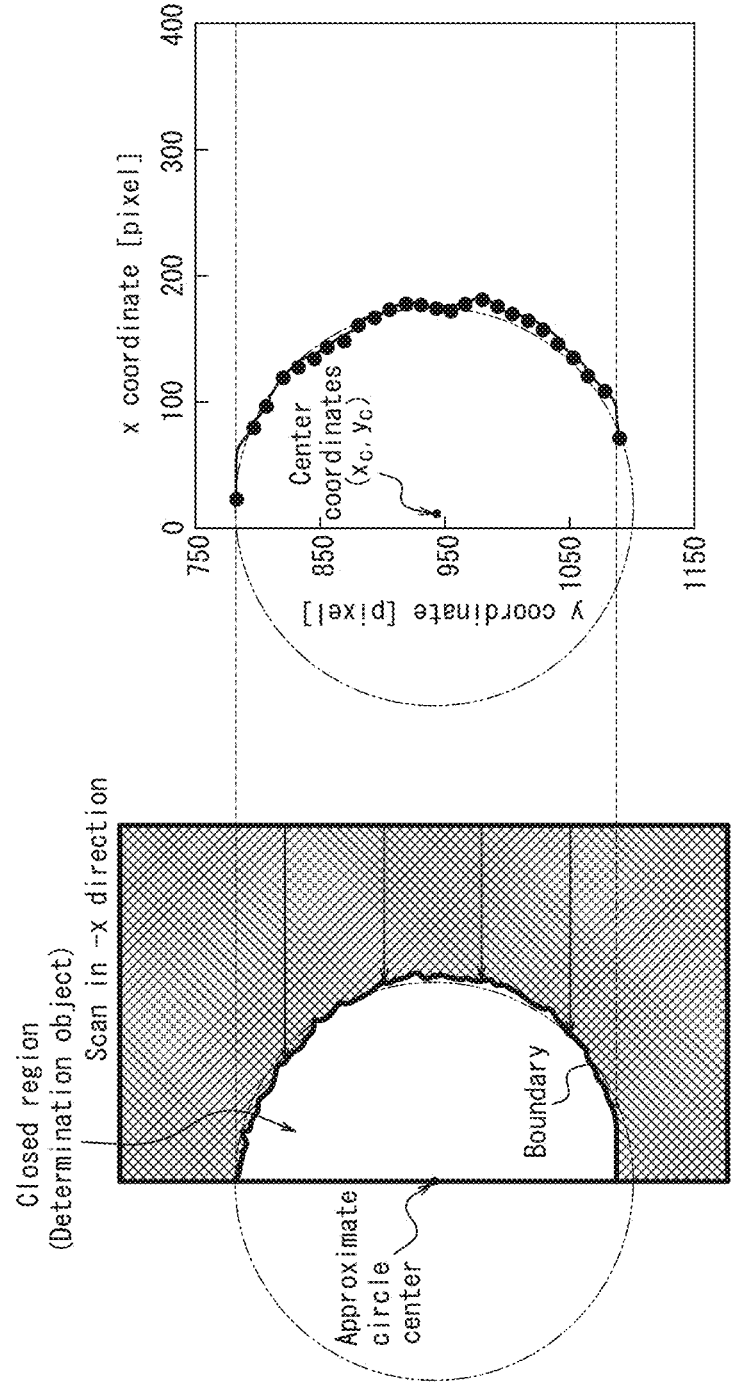
FIG. 11A is a diagram illustrating another specific example of a technique for obtaining calculated values in the fourth step of the evaluation method according to this disclosure, performed on the closed region extracted from the region c in FIG. 8A.

Another specific example of calculations by the fourth step (S40) are sequentially described with reference to FIG. 11A and FIG. 11B alternatively to the specific example with reference to FIG. 10A and FIG. 10B. The closed region (the region c in FIG. 8A) extracted in the third step (S30) that is the same as the closed region in FIG. 10A is displayed on the left side in FIG. 11A. The white pixel region is the closed region to be subjected to the determination. The −x direction scanning was performed to obtain the boundary coordinate information (the right side in the center in FIG. 11A). An approximate circle inscribed in a boundary was calculated from the coordinate information (x,y) of the boundary, and the center coordinates $(x_c,y_c)$ were found and are depicted with the coordinate information (x,y) (the right side in FIG. 11A). When the center coordinates $(x_c,y_c)$ of the approximate circle is located inside the closed region to be subjected to the determination (white pixel area), the closed region to be subjected to the determination (white pixel area) can be determined to correspond to cristobalite.

Figure 11B:
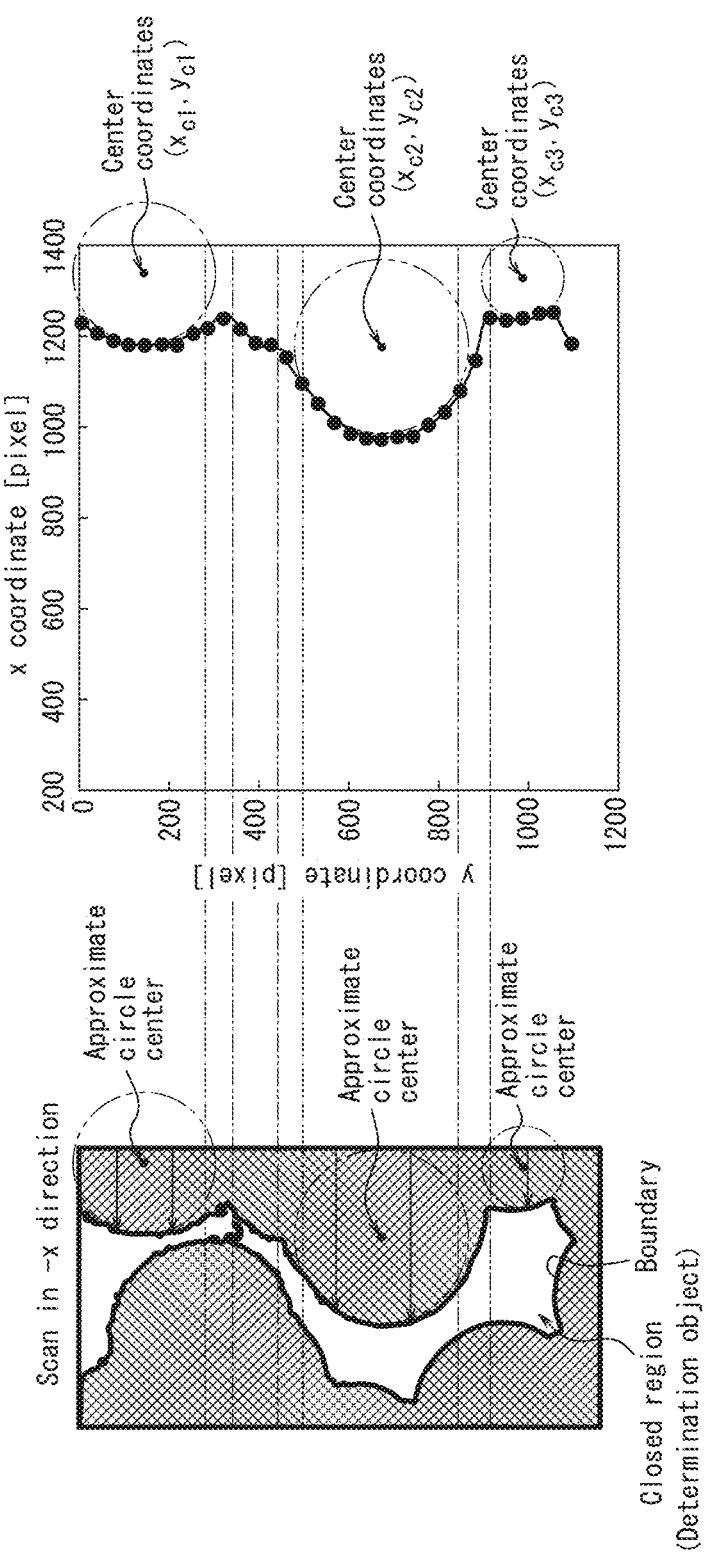
FIG. 11B is a diagram illustrating another specific example of a technique for obtaining calculated values in the fourth step of the evaluation method according to this disclosure, performed on the closed region extracted from the region b in FIG. 8A.

The closed region (the region b in FIG. 8A) extracted in the third step (S30) that is the same as the closed region in FIG. 10B is displayed on the left side in FIG. 11B. The white pixel region is the closed region to be subjected to the determination. The −x direction scanning was performed to obtain the boundary coordinate information (the right side in FIG. 11B). Approximate circles inscribed in a boundary were calculated from the coordinate information (x,y) of the boundary, and the individual center coordinates $(x_{c1},y_{c1})$, $(x_{c2},y_{c2})$, and $(x_{c3},x_{c3})$ were found and are depicted with the coordinate information (x,y) (the right side in FIG. 11A). Since the center coordinates of each approximate circle is not located in the closed region to be subjected to the determination (white pixel region) (i.e., located in a black pixel region), the closed region to be subjected to the determination (white pixel area) can be determined to correspond to glass. As in the case of the example in FIG. 11B, when the center coordinates of a plurality of approximate circles are obtained, the determination may be performed based on the number of the approximate circles of which center coordinates are located in the closed region to be subjected to the determination. Further, weighting is performed using the radius, the number of data, the coefficient of correlation, etc. of the approximate circles in combination, thereby determining the determination coefficient.

The fourth step (S40) can also be performed by calculating the approximate circles inscribed in the boundary from the coordinate information of the boundary. In this case, in the fifth step (S50), the determination can be performed based on the positional relationship between the center coordinates of the approximate circles and the closed region.

Note that the arithmetic calculations described with reference to FIG. 10A, FIG. 10B, FIGS. 11A, and 11B are merely specific examples, and any given operations based on the shape corresponding to cristobalite can be adopted. The resultant calculated values are preferably subjected to the determination by the fifth step (S50) based on the determination values found by weighting using the calculated values obtained by the fourth step (S40) and the number of data used to find the calculated values.

Further, the threshold for extracting the closed region or the threshold for performing the arithmetic calculations may be set appropriately.

<Sixth Step>

In the sixth step (S60), a full image is obtained by compositing images of the closed regions determined to be cristobalite through the steps up to the fifth step (S50). The closed regions determined to be cristobalite may be overlaid by OR operations. An example is illustrated in FIG. 12. Note that the region b (i.e., the white pixel region in FIG. 8C) in FIG. 8A is determined to be glass but not cristobalite, so that this region is excluded in the OR operations. Since the inside of the closed region has been converted to white pixels in the third step, the white pixel region in the full image can be deemed to correspond to cristobalite.

Using an evaluation method of this disclosure, the full image of the binary images corresponding to cristobalite can easily be evaluated in a short time (approximately several minutes). Unlike the sketch made by workers, variations depending on the workers do not occur, and the entire inner circumference of the quartz crucible can be subjected to image acquisition. Further, as described in EXAMPLES below, when comparing the evaluation method of this disclosure and the conventional technique using sketches made by workers, the disclosed method gives a sufficiently low error rate.

<Seventh Step>

The evaluation method according to this disclosure preferably further includes a seventh step of quantifying and evaluating cristobalite formed on the inner circumference of the quartz crucible based on the full image obtained by the sixth step (S60). In addition to the area ratio of cristobalite actually formed with respect to the area of the entire inner circumference, the size of the cristobalite, the number of connections therein, the density thereof per unit area, the distribution index of the cristobalite, etc.; statistical indices (average, dispersion, rate of change, etc.) based on them can be calculated appropriately using the full image and the extracted closed regions.

Further, the thus quantified and evaluated feature values can be fed back to adjust the quartz crucible production conditions or the silicon single crystal pulling conditions.

For example, the quantitative relationship between the area ratio of cristobalite with respect to the area of the entire inner circumference of the quartz crucible and the quartz crucible production conditions may be investigated to reduce the area ratio of the cristobalite by changing the quartz crucible production conditions.

(2. Apparatus for Evaluating Inner Circumference of Quartz Crucible)

Reference is made to FIG. 3. The quartz crucible inner circumference evaluation apparatus 100 includes: an imager 10 that is slidably installed along the central axis of the quartz crucible 80 and is rotatably mounted about the central axis inside the quartz crucible; and an arithmetic unit 20 which processes a captured image of the inner circumference of the quartz crucible 80, taken by the imager 10. The processes performed by the arithmetic unit 20 includes: (i) performing image processing on the captured image to obtain an edge image in which boundaries between cristobalite and glass are extracted; (ii) extracting closed regions enclosed by the boundaries in the edge image and performing arithmetic calculations on coordinate information of the boundaries enclosing the extracted closed regions based on outer ring shapes of the cristobalite, thereby obtaining calculated values; (iii) determining whether the closed regions are the cristobalite or the glass based on the calculated values; and (iv) compositing images in which closed regions are determined to be the cristobalite are overlaid, thereby obtaining a full image. The details of the processes (i) to (iv) above performed by the arithmetic unit 20 are as described in the embodiment of the evaluation method, and the same procedures will not be described again. An aspect preferably applied to the embodiment of the evaluation method is preferably performed by the arithmetic unit 20. The imager 10 may use, for example, a digital camera using a solid-state imaging device, and the arithmetic unit 20 may use a computer such as a general-purpose computer. Further, as the mechanism allowing the imager 10 to be slidably installed along the central axis of the quartz crucible and to be rotatably mounted about the central axis, a mechanism using the cross arm 31 depicted in FIG. 3 may be used; alternatively, a mechanism in which the imager is attached to the end of an articulated robot arm may be used.

(3. Specific Aspects)

Specific aspects of a quartz crucible will now be described; however, the subject matter to which this disclosure can be applied is not limited to the specific aspects in any way.

Typically, a crucible having a dual structure having an inner quartz crucible an outer graphite crucible is used to grow a silicon single crystal ingot by the CZ process. The outer circumference of a quartz crucible to which this disclosure is applied may be provided with a crucible made of a material other than quartz, such as a graphite crucible.

Further, the diameter of the quartz crucible is larger than the diameter of a silicon single crystal ingot to be pulled up; specifically, crucibles having a diameter of 22 in (approximately 550 mm) or more are typically used.

EXAMPLES

<Image Acquisition>

Captured images of the entire inner circumference of a quartz crucible was acquired using the imager 10 of the evaluation apparatus 100 schematically depicted in FIG. 3. One of the captured images is given as a representative example in FIG. 13A.

Conventional Example

Figure 13A:
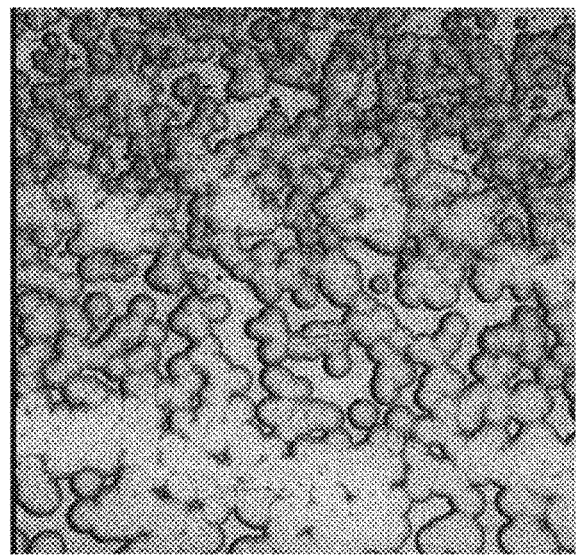
FIG. 13A is a part of a captured image of the inner circumference of a quartz crucible in Example.

As before, sketches of the entire inner circumference including a part corresponding to the captured image in FIG. 13A were made by workers. It took 90 minutes to make the sketches. An image obtained by converting the sketch of the part corresponding to the captured image of FIG. 13A is given in FIG. 13B.

Example

A full image was obtained by overlaying/compositing images of closed regions determined to be cristobalite according to the flow charts in FIG. 2, FIG. 5, and FIG. 7. The composite image is given in FIG. 13C. For the image processing, commercially available industrial image processing software was used.

<Comparison>

Figure 13B:
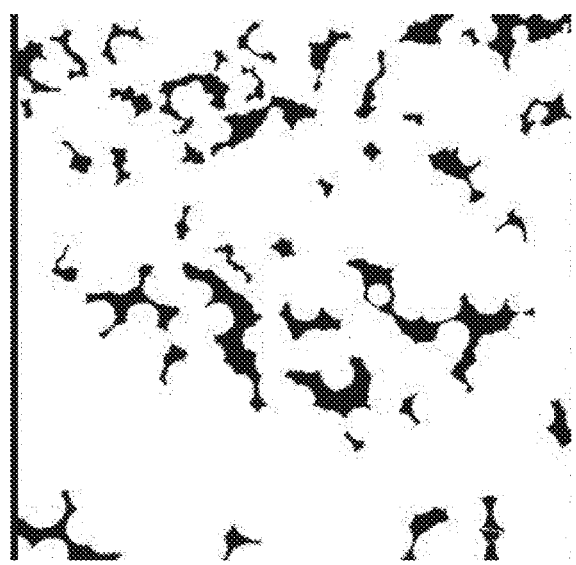
FIG. 13B is an image obtained by converting to binary a sketch obtained from FIG. 13A by a conventional technique.
Figure 13C:
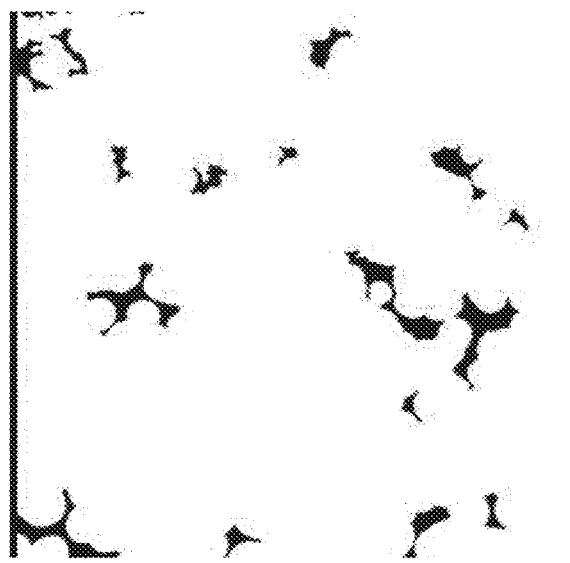
FIG. 13C is a composite image obtained from FIG. 13A by the disclosed technique.
Figure 13D:
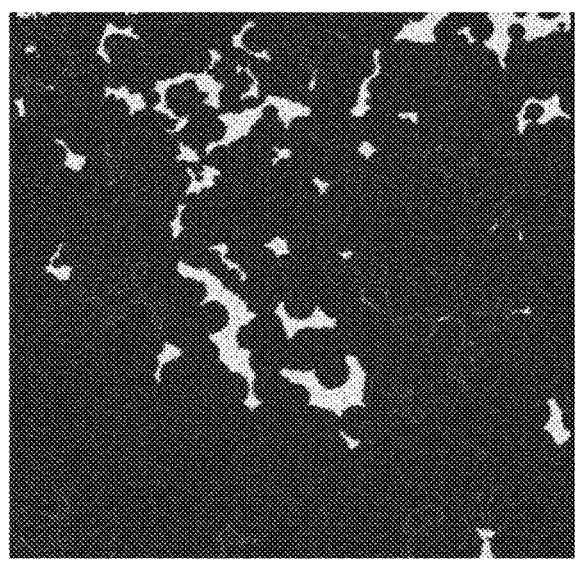
FIG. 13D is a image acquired by obtaining the difference between FIG. 13B and FIG. 13C (AND operations).

To identify the difference between the image of FIG. 13B and the image of FIG. 13C, a difference image between them was acquired (AND operations). The result is given in FIG. 13D. With respect to the area ratio of cristobalite, the difference between the cristobalite area ratios between them was approximately several percent, and the method of this disclosure was confirmed to achieve sufficient accuracy. The method of this disclosure is very advantageous in that the evaluation can be performed rapidly and objectively, compared with the conventional technique.

INDUSTRIAL APPLICABILITY

This disclosure provides an evaluation method capable of easily evaluating the inner circumference of a quartz crucible in a short time and an apparatus for evaluating the inner circumference of the quartz crucible that is used for the evaluation method.

The invention claimed is:

1. A method of evaluating an inner wall portion of a quartz crucible, comprising:
   after a silicon single crystal ingot has been pulled up from the quartz crucible, imaging the inner wall portion of the quartz crucible from which the silicon single crystal ingot had been pulled up, thereby obtaining a captured image of the inner wall portion;
   performing image processing on the captured image to obtain an edge image in which boundaries between cristobalite and glass are extracted;
   extracting closed regions enclosed by the boundaries in the edge image;
   performing arithmetic calculations on coordinate information of the boundaries enclosing the extracted closed regions based on outer ring shapes of the cristobalite, thereby obtaining calculated values;
   determining whether the closed regions are the cristobalite or the glass based on the calculated values; and
   compositing images in which closed regions are determined to be the cristobalite are overlaid, thereby obtaining a full image.

2. The method of evaluating an inner wall portion of a quartz crucible according to claim 1, wherein in the performing the arithmetic calculations, a straight-line approximation equation of differential values found from the coordinate information of the boundaries is calculated.

3. The method of evaluating an inner wall portion of a quartz crucible according to claim 2, wherein in the determining whether the closed regions are the cristobalite or the glass, the determination is performed based on a slope of the straight-line approximation equation.

4. The method of evaluating an inner wall portion of a quartz crucible according to claim 1, wherein the performing the arithmetic calculations, one or more approximate circles inscribed in each boundary are calculated from the coordinate information of the boundaries.

5. The method of evaluating an inner wall portion of a quartz crucible according to claim 4, wherein in the determining whether the closed regions are the cristobalite or the glass, the determination is performed based on positional relationship between center coordinates of the approximate circles and the closed regions.

6. The method of evaluating an inner wall portion of a quartz crucible according to claim 1, wherein in the determining whether the closed regions are the cristobalite or the glass, determination values are found by weighting using the calculated values and a number of data used to find the calculated values in the performing the arithmetic calculations, and the determination is performed using the determination values.

7. The method of evaluating an inner wall portion of a quartz crucible according to claim 2, wherein in the determining whether the closed regions are the cristobalite or the glass, determination values are found by weighting using the calculated values and a number of data used to find the calculated values in the performing the arithmetic calculations, and the determination is performed using the determination values.

8. The method of evaluating an inner wall portion of a quartz crucible according to claim 3, wherein in the determining whether the closed regions are the cristobalite or the glass, determination values are found by weighting using the calculated values and a number of data used to find the calculated values in the performing the arithmetic calculations, and the determination is performed using the determination values.

9. The method of evaluating an inner wall portion of a quartz crucible according to claim 4, wherein in the determining whether the closed regions are the cristobalite or the glass, determination values are found by weighting using the calculated values and a number of data used to find the calculated values in the performing the arithmetic calculations, and the determination is performed using the determination values.

10. The method of evaluating an inner wall portion of a quartz crucible according to claim 5, wherein in the determining whether the closed regions are the cristobalite or the glass, determination values are found by weighting using the calculated values and a number of data used to find the calculated values in the performing the arithmetic calculations, and the determination is performed using the determination values.

11. The method of evaluating an inner wall portion of a quartz crucible according to claim 1, further comprising quantifying and evaluating the cristobalite formed on the inner wall portion based on the full image obtained in the compositing the images.

12. An apparatus for evaluating an inner wall portion of a quartz crucible, comprising:
    an imager that is slidably installed along a central axis of the quartz crucible and is rotatably mounted about the central axis inside the quartz crucible; and
    an arithmetic unit which processes a captured image of the inner wall portion of the quartz crucible, taken by the imager, wherein the processes performed by the arithmetic unit includes:
(i) performing image processing on the captured image to obtain an edge image in which boundaries between cristobalite and glass are extracted;
(ii) extracting closed regions enclosed by the boundaries in the edge image and performing arithmetic calculations on coordinate information of the boundaries enclosing the extracted closed regions based on outer ring shapes of the cristobalite, thereby obtaining calculated values;
(iii) determining whether the closed regions are the cristobalite or the glass based on the calculated values; and
(iv) compositing images in which closed regions are determined to be the cristobalite are overlaid, thereby obtaining a full image.

* * * * *